(12) United States Patent
Boufnichel

(10) Patent No.: US 12,506,009 B2
(45) Date of Patent: Dec. 23, 2025

(54) CAVITY FORMING METHOD

(71) Applicant: STMICROELECTRONICS (TOURS) SAS, Tours (FR)

(72) Inventor: Mohamed Boufnichel, Monnaie (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 417 days.

(21) Appl. No.: 18/148,329

(22) Filed: Dec. 29, 2022

(65) Prior Publication Data

US 2023/0215733 A1 Jul. 6, 2023

(30) Foreign Application Priority Data

Jan. 6, 2022 (FR) ........................ 2200095

(51) Int. Cl.
*H01L 21/308* (2006.01)
*H01L 21/306* (2006.01)
*H01L 21/762* (2006.01)
*H01L 21/78* (2006.01)
*H10D 62/10* (2025.01)
*H10D 8/00* (2025.01)
*H10D 8/01* (2025.01)

(52) U.S. Cl.
CPC .... *H01L 21/3086* (2013.01); *H01L 21/30604* (2013.01); *H01L 21/3083* (2013.01); *H01L 21/76224* (2013.01); *H01L 21/76232* (2013.01); *H01L 21/78* (2013.01); *H10D 62/102* (2025.01); *H10D 62/103* (2025.01); *H10D 62/104* (2025.01); *H10D 8/045* (2025.01); *H10D 8/422* (2025.01); *H10D 62/117* (2025.01)

(58) Field of Classification Search
None
See application file for complete search history.

(56) References Cited

FOREIGN PATENT DOCUMENTS

| | | | | |
|---|---|---|---|---|
| JP | S5526670 | * | 2/1980 | ......... H01L 21/3083 |
| JP | S5526670 A | | 2/1980 | |
| JP | S5850416 B2 | | 11/1983 | |
| JP | S60119729 A | | 6/1985 | |
| JP | H08227872 A | | 9/1996 | |
| JP | 2005051111 A | | 2/2005 | |

OTHER PUBLICATIONS

Chung et al., "Modelling and fabrication of step height control of a multilevel Si(100) structure in KOH solution," *Journal of Micromechanics and Microengineering* 14:341-346, 2004.

* cited by examiner

*Primary Examiner* — Jiong-Ping Lu
(74) *Attorney, Agent, or Firm* — Seed Intellectual Property Law Group LLP

(57) ABSTRACT

The present description concerns a method of forming a cavity in a substrate comprising: the forming of an etch mask comprising, opposite the location of the cavity, a plurality of sets of openings, the ratio between the openings and the mask of each set being selected according to the desired profile of the cavity opposite the surface of the mask having the set inscribed therein; and the wet etching of the substrate through the openings.

18 Claims, 8 Drawing Sheets

CAVITY FORMING METHOD

CROSS-REFERENCE TO RELATED APPLICATION

This application claims the priority benefit of French patent application number FR2200095, filed on Jan. 6, 2022, entitled "Procédé de formation d'une cavité," which is hereby incorporated by reference to the maximum extent allowable by law.

BACKGROUND

Technical Field

The present disclosure relates to electronic devices and their manufacturing methods, and more particularly, cavities and their manufacturing methods.

Description of the Related Art

During the manufacturing of an electronic device, the selection of the manufacturing method is dependent, among others, on the dimensions of the desired device.

The dimension variations of an electronic device or of a portion of an electronic device may cause changes in the results of the manufacturing methods used, for example, in the etch methods.

BRIEF SUMMARY

An embodiment overcomes all, or part, of the disadvantages of known cavity forming methods.

An embodiment provides a method of forming a cavity in a substrate, where the forming of an etch mask comprising, opposite the location of the cavity, a plurality of sets of openings, the ratio between the openings and the mask of each set being selected according to the desired profile of the cavity opposite the surface of the mask having the set inscribed therein; and the wet etching of the substrate through the openings.

According to an embodiment, the ratio between the openings and the mask of each set conditions the depth of the cavity opposite the surface of the mask having the set inscribed therein.

According to an embodiment, the surface having a set of openings inscribed therein is a continuous surface and comprises no opening of another set.

According to an embodiment, the cavity crosses at least one PN junction.

According to an embodiment, the mask comprises a first set of openings comprising at least one opening, and at least one second set, each second set comprising at least two openings, the ratio between the openings and the mask of the first set being greater than the ratios between the openings and the mask of each second set.

According to an embodiment, the ratio between the openings and the mask of the second sets decreases with the increase of the distance between the second set and the first set.

According to an embodiment, the first set comprises a single opening.

According to an embodiment, the first set comprises a plurality of openings arranged in a row.

According to an embodiment, the first set comprises a plurality of openings arranged in at least two parallel rows.

According to an embodiment, the openings of each second set are arranged in a row parallel to the first set.

According to an embodiment, the arrangement of the second sets is symmetrical with respect to the first set.

According to an embodiment, the mask comprises a resin layer resting on an oxide layer.

According to an embodiment, the openings of a same set are substantially identical to one another.

Another embodiment provides a method of manufacturing a device comprising a cavity obtained by a previously-described method, and comprising the forming of an electrically-insulating layer and of a protection layer on the walls of the cavity and on the portion of the substrate directly surrounding the cavity.

Another embodiment provides a method of manufacturing a device comprising two cavities located on opposite sides of the substrate, the two cavities being obtained by the previously-described method, wherein the wet etch step is carried out simultaneously for the two cavities.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Certain features have been designated by like references in the various figures. In particular, the structural and/or functional features that are common among the various embodiments may have the same references and may dispose identical structural, dimensional, and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front," "back," "top," "bottom," "left," "right," etc., or to relative positional qualifiers, such as the terms "above," "below," "upper," "lower," etc., or to qualifiers of orientation, such as "horizontal," "vertical," etc., reference is made to the orientation shown in the figures.

Unless specified otherwise, the expressions "around," "approximately," "substantially," and "in the order of" signify within 10%, and preferably within 5%.

Figure 1:
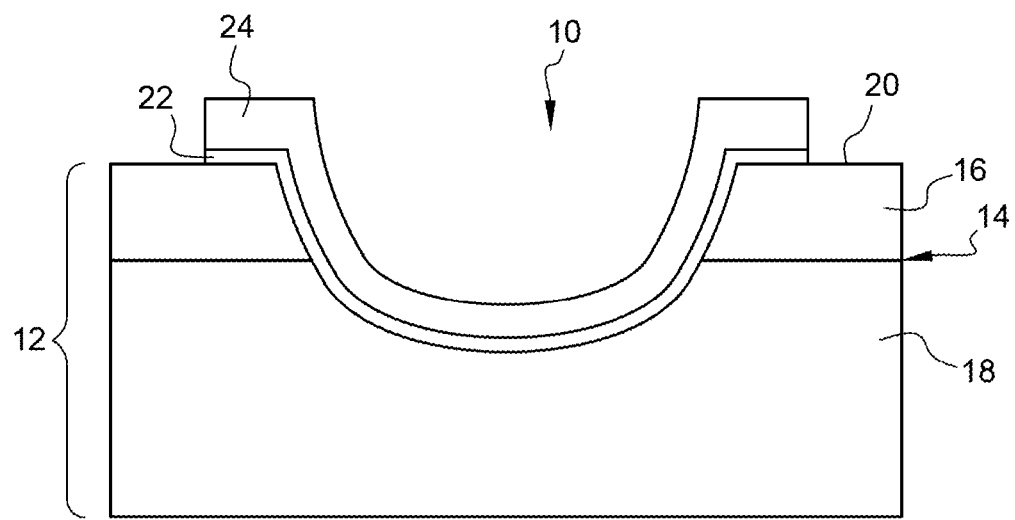
FIG. 1 shows an example of a cavity.

FIG. 1 shows an example of a cavity 10. The cavity 10 is located in a semiconductor substrate 12.

The semiconductor substrate 12 comprises a PN junction 14. The substrate 12 further comprises a first layer 16 and a second layer 18. Layers 16 and 18 are doped with opposite conductivity types. The first layer 16 is, for example, N-type doped and the second layer 18 is, for example, P-type doped. The first layer 16 rests on the second layer 18. The first and second layers 16, 18 are in contact to form the PN junction 14. The first and second layers 16, 18, for example, comprise heavily-doped regions and more lightly-doped regions. For example, the regions of the first and second layers 16, 18 located at the level of the PN junction 14 are more heavily doped than central portions of the first and second layers 16, 18.

The cavity 10 is formed so as to cross the PN junction 14. In other words, the cavity 10 walls expose the PN junction 14. Thus, the cavity 10 extends, in the substrate 12, from a surface 20 of the first layer 16 to a level located in the second layer 18. The surface 20 of the first layer 16 corresponds to the surface opposite to the surface in contact with the second layer 18. The first layer 16 is substantially or completely crossed by the cavity 10, and the second layer 18 is partially crossed by the cavity 10.

The cavity 10, for example, separates electronic components formed in the substrate 12. For example, a diode is formed on each side of the cavity 10, the diode thus being separated by the cavity 10.

For example, the substrate 12 is intended to be divided at the level of the cavity 10. For example, the cavity 10 forms a groove, separating various devices or chips or discrete components, at the level of which the chips will be divided. Thus, the cavity 10 corresponds to a grid extending between the components of a wafer of components to be divided. For example, the cavity 10 separates power electronic components, such as diodes, triacs, diacs, or thyristors that are intended to be individualized and to form discrete components.

An electrically-insulating layer 22, for example, made of an oxide, or an oxygen-doped silicon oxide, covers all the walls, i.e., the lateral walls and the bottom of the cavity 10. The electrically-insulating layer 22 also partially covers the substrate 12. More precisely, the electrically-insulating layer 22 covers a region of the substrate 12 surrounding the cavity 10.

A third layer 24 made of a protection material, for example, an electrically-insulating material such as glass, is formed on the electrically-insulating layer 22. The third layer 24 entirely covers the electrically-insulating layer 22. The third layer 24 preferably only covers the electrically-insulating layer 22. Vertical edges or sidewalls of the third layer 24 and the insulating layer 22 are coplanar and transverse to surface 20.

To avoid leakages of electric charges from the PN junction 14 at the level of the cavity 10, the walls of the cavity 10 are, at the level of the PN junction 14, curved. The presence of horizontal walls, i.e., located in a plane orthogonal to the PN junction 14, at the level of the PN junction 14 would cause significant leakages.

Further, the presence of layers 22 and 24 insulates and protects the cavity walls and decreases leakages.

It is known in the art to form such cavities having a depth smaller than 75 μm. Such cavities are adapted to the forming of power components intended to withstand a voltage smaller than 800 V. Forming power components intended to withstand a voltage greater than 800 V implies the forming of a deeper cavity. However, manufacturing methods used to form cavities having a depth smaller than 75 μm are not adaptable to greater depths.

Indeed, the use of known methods for the forming of such cavities causes several problems. The curvature of the walls is not easily controllable for such dimensions. The walls then may not have the profile enabling to decrease leakages. Further, the etching of the cavity may then etch regions, for example, at the level of the upper surface of the substrate, which are not intended to be etched. It is also possible for the walls not to be symmetrical, without for this to be desired. Further, the depth increase causes a modification of the angle between the upper surface of the substrate 12 and the lateral walls of the cavity 10, which becomes more acute. The deposited thickness of the electrically-insulating layer 22 and the third layer 24 at the level of the angle may then be too small, which causes a decrease in the protection of the junction and a decrease in the hold of the electrically-insulating and third layers 22, 24 on the substrate 12. Trying to compensate by increasing the thickness of the layers may cause too large a thickness elsewhere, for example, at the bottom of the cavity 10. The etching of the electrically-insulating layer 22 and the third layer 24 then becomes difficult.

FIGS. 2 and 3, and 7 to 12 show steps, preferably successive, of an embodiment of a cavity forming method.

Figure 2:
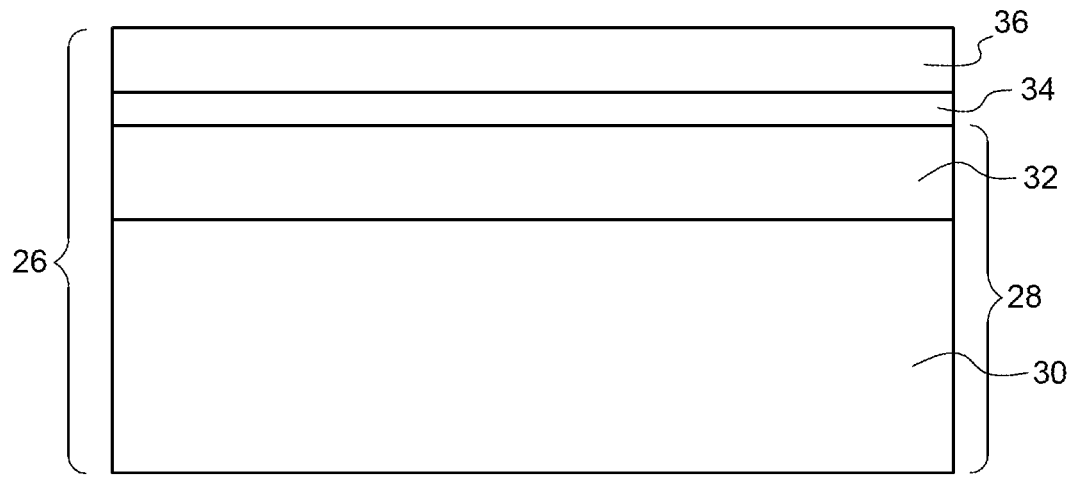
FIG. 2 shows a step of an embodiment of a cavity forming method.

FIG. 2 shows a step of an embodiment of a cavity forming method.

During this step, a stack of layers 26 is formed. The stack of layers 26 comprises a substrate 28 that may be a semiconductor. The substrate 28 is the substrate where the cavity will be formed. The substrate 28 preferably comprises at least one PN junction. In other words, the substrate 28 comprises at least a first doped semiconductor layer 30 of a first conductivity type, for example, type N, and a second doped semiconductor layer 32 of a second conductivity type, for example, type P. The first and second doped semiconductor layers 30, 32 are in contact to form the PN junction. In the case of FIG. 2, the second doped semiconductor layer 32 rests on the first doped semiconductor layer 30. Thus, a lower surface of the second doped semiconductor layer 32 is in contact with an upper surface of the first doped semiconductor layer 30. The first and second doped semiconductor layers 30 and 32 are, for example, made of a same semiconductor material, for example, of silicon. The dopant concentration may be different in certain portions of the first and second doped semiconductor layers 30, 32. Thus, layers 30 and 32 may have regions more heavily doped than others.

In the case of FIG. 2, the substrate 28 comprises a single PN junction. As a variant, the substrate 28 may comprise a plurality of PN junctions. The cavity will then be preferably intended to cross all the PN junctions with a curvature enabling to decrease leakages.

Electronic components, formed from the PN junction, are for example, formed in the substrate, outside of the location of the cavity.

The stack of layers 26, for example, comprises an insulating layer 34 resting on the second doped semiconductor layer 32. In other words, a lower surface of the insulating layer 34 is in contact with an upper surface of the second doped semiconductor layer 32. The insulating layer 34 is made of an insulating material, preferably of an oxide, for example, of silicon oxide. The insulating layer 34 rests at least on the portion of the substrate 28 at the location of the cavity. The insulating layer 34 may be etched at other locations, for example, to allow a doping step.

The stack of layers 26 comprises a mask 36. The mask 36 is a photolithography mask. The mask 36 is made of resin. The mask 36 is, at this step, a continuous layer resting all over the insulating layer 34.

Figure 3:
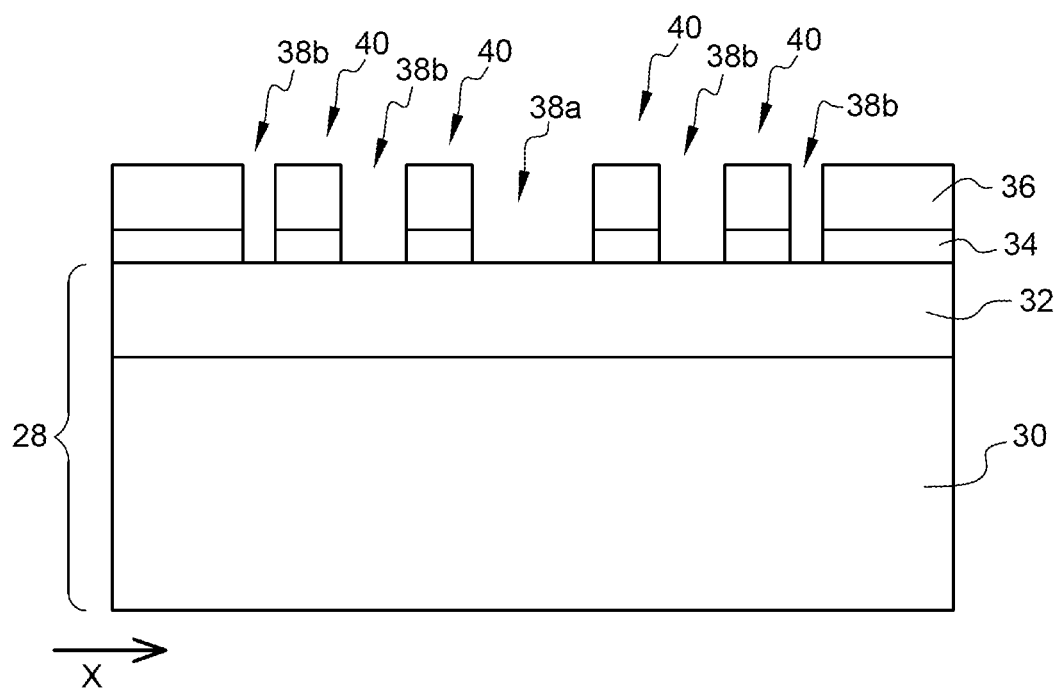
FIG. 3 shows another step of an embodiment of a cavity forming method.

FIG. 3 shows another step of an embodiment of a cavity forming method.

During the step having its result illustrated in FIG. 3, the photolithography method is continued by the etching of the mask 36 to form a plurality of openings 38 (38a and 38b) in the mask layer 36. The insulating layer 34 is then etched through the plurality of openings 38. The method of etching the insulating layer 34 is preferably a method of selective etching of the insulating layer 34 over the second doped semiconductor layer 32. Thus, the second doped semiconductor layer 32 is preferably not etched during this step.

The plurality of openings 38 are arranged in different sets, the ratio between the openings 38 and the mask 36 of each set being selected according to the desired profile of the cavity opposite the surface of the mask, having the set inscribed therein. By ratio between the openings 38 and the mask 36 of each set, there is meant the value of the area, in a horizontal plane, for example, the plane of the upper surface of mask 36, of the openings of said set divided by the value of the area, in the same plane, of the mask 36, that is, the portions outside of the openings 38. By surface area of the mask having the set inscribed therein for example there is meant the smallest continuous surface area in the plane of the mask, for example, the upper surface of the mask, containing all the openings of said set. The surface area having a set inscribed therein comprises no opening of another set. Further, each opening 38 in the mask 36 located opposite the location of the cavity, forms part of a set. The surface areas having two distinct sets inscribed therein are not superimposed.

FIG. 3 further illustrates five openings (38a, 38b) forming part of five different sets of openings, a main opening 38a and four secondary openings 38b. In the cross-section view along the plane of FIG. 3, the main opening 38a is located substantially at the center of the location of the cavity. More generally, the mask 36 comprises, in the plane of FIG. 3, at least one main opening 38a and at least one set of secondary openings 38b, preferably at least one set of secondary openings 38b on each side of the main opening 38a, each set of secondary openings 38b comprising at least two secondary openings 38b. The secondary openings 38b shown in FIG. 3 are thus on the opposite sides of the main opening 38a.

The openings 38 are separated in FIG. 3 from one another by a plurality of portions 40 of the insulating layer 34 and the mask layer 36, that is, a stack of a portion of the insulating layer 34 and of a portion of the mask layer 36. By width of an opening, there is meant the dimension of an opening in the X direction, horizontal in the cross-section plane of FIG. 3, that is, the distance, in the plane of FIG. 3, between the portions 40 delimiting the opening.

Secondary openings 38b, for example, have widths smaller than the width of the main opening 38a. For example, the widths of the secondary openings 38b are between the width of the main opening 38a and a 2-μm width. Preferably, the secondary opening 38b most distant from the main opening 38a, that is, the smallest secondary opening 38b, has a width substantially equal to 2 μM.

Figure 4:
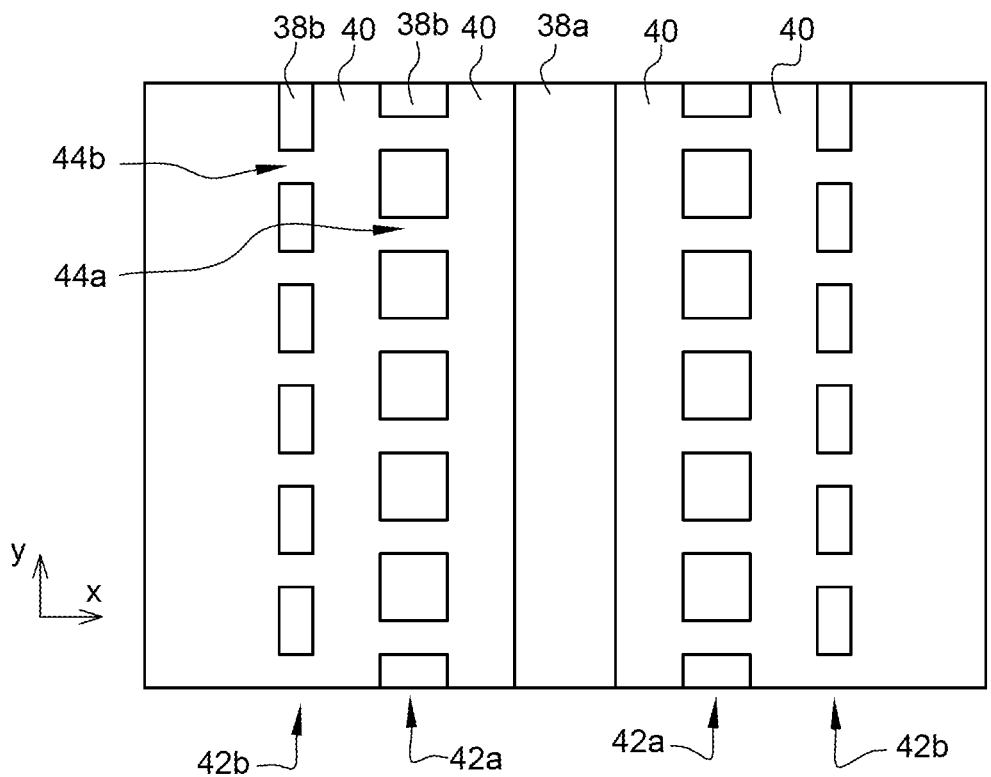
FIG. 4 shows a top view of FIG. 3.
Figure 5:
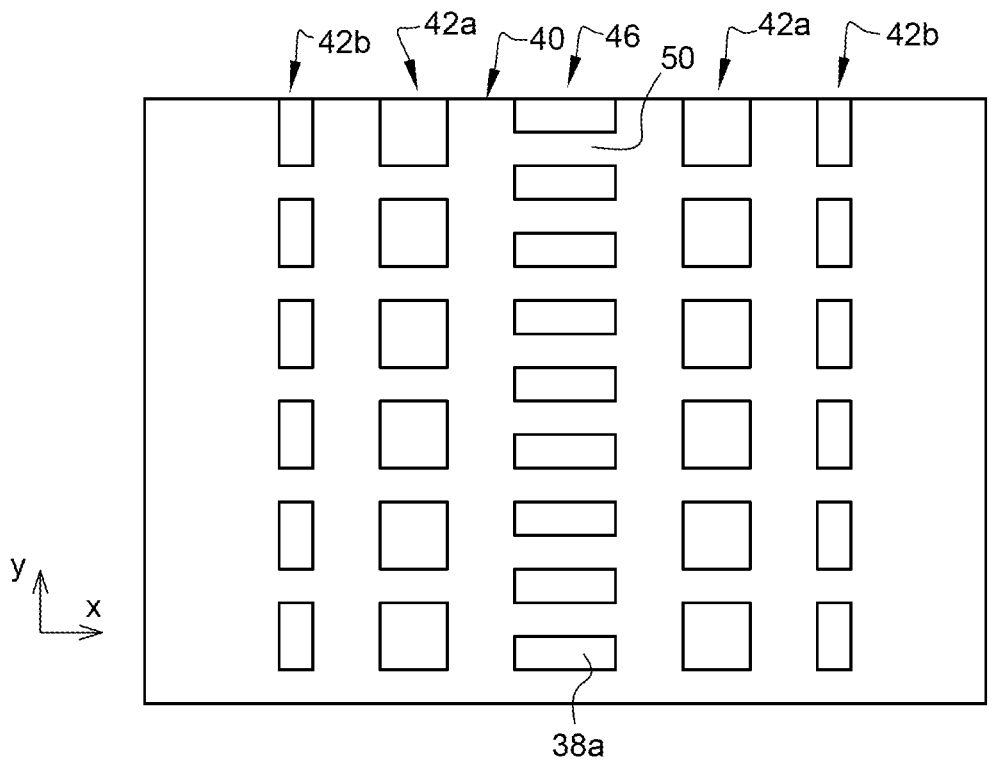
FIG. 5 shows a variant of FIG. 4.
Figure 6:
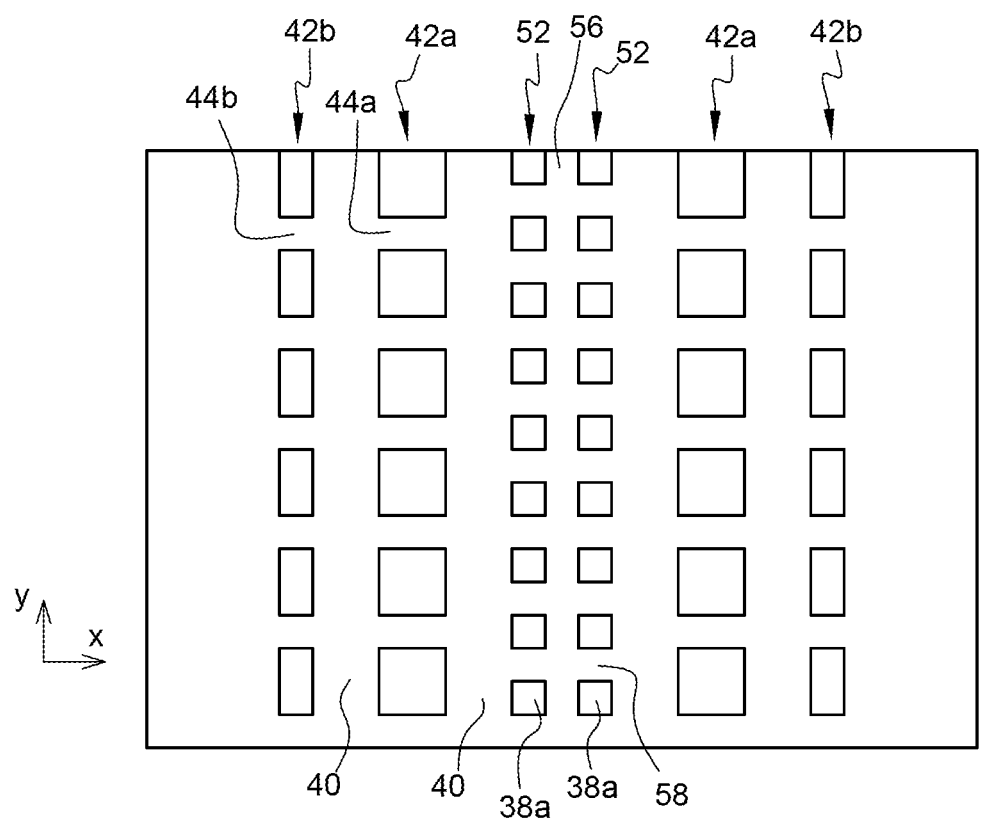
FIG. 6 shows another variant of FIG. 4.

FIGS. 4 through 6 show a top view of several embodiments of arrangements of the openings 38.

FIG. 4 shows a top view of a cavity according to an embodiment described in FIG. 3.

In the top view shown in FIG. 4, an X direction corresponds to the horizontal direction of FIG. 3. A Y direction in the top view shown in FIG. 4 corresponds to a direction orthogonal to the X direction.

The cavity which is intended to be formed extends in the Y direction. In other words, the length that is, the longest dimension, of the cavity is the dimension in the Y direction.

The ratio between the openings 38 and the mask layer 36 of each set conditions the depth of the cavity opposite said surface. Thus, to form cavities having a profile enabling to protect the PN junctions and to avoid leakages, the ratio between the openings 38 and the mask layer 36 of the set of openings 38a is greater than the ratios between the openings 38 and the mask layer 36 of each set of openings 38b. Further, the ratio between the openings 38 and the mask layer 36 of the sets of openings 38b decreases with the increase of the distance between the second set and the first set. Thus, the more the set of openings 38b is distant from the set of openings 38a, the smaller said ratio.

In the embodiment of FIG. 4, the set of openings 38 comprises the main opening 38a. The main opening 38a extends in the Y direction. In other words, the length of the main opening 38a, that is, the longest dimension of the main opening 38a in the plane of FIG. 4, is the dimension in the Y direction. The width of the main opening 38a is the dimension in the X direction.

Each set of secondary openings 38b is arranged in a row in the embodiment of FIG. 4. At least one row 42 (42a and 42b), preferably at least two rows, of secondary openings 38b is located on each side of the main opening 38a in the X direction. In the example of FIG. 4, rows 42 are straight lines. In the example of FIG. 4, two rows 42a and 42b are located on each side of the main opening 38a. Each of row 42 is a set of openings distinct from the other rows, rows 42a being closer to the main opening 38a. Thus, each row 42a is located between a row 42b and the main opening 38a. Each row 42 extends in the Y direction. In other words, the main direction of rows 42 is the Y direction. Rows 42 and the main opening 38a are thus parallel to one another.

Each row 42 comprises a plurality of secondary openings 38b. The secondary openings 38b of each row have preferably the same dimensions. The ratio between the openings and the mask of a row 42 is smaller than the ratio between the openings and the mask of the main opening 38a. The width, that is, the dimension in the X direction, of each secondary opening 38b of a row 42 is, for example, smaller than the width of the main opening 38a.

The ratio between the openings and the mask of a row 42 decreases with the distance of the row to the main opening 38a. In other words, the ratio between the openings and the mask of a given row 42 is smaller than or equal to the ratio between the openings and the mask of a row 42 closer to the main opening 38a. In the example of FIG. 4, the secondary openings 38b of row 42a on one side of the main opening 38a have a ratio greater than the ratio of row 42b on the same side of the main opening 38a. For example, if the secondary openings 38b of rows 42a and 42b have, as in FIG. 4, a same dimension in the Y direction, the dimension in the X direction of the secondary openings 38b of row 42a is greater than the dimension in the X direction of the secondary openings 38b of row 42b.

The secondary openings 38b of a same secondary row 42a or 42b are separated from one another by portions 44a and 44b of the stack of the insulating and mask layers 34, 36. More precisely, in the example of FIG. 4, the secondary openings 38b of a row 42a are separated from one another by portions 44a and the secondary openings 38b of a row 42b are separated from one another by portions 44b.

The portions 44a and 44b of a same row 42a or 42b, for example, all have the same dimensions. The dimension in the Y direction of each of the portions 44a and 44b of a row 42a or 42b is, for example, smaller than the dimension in the Y direction of the secondary openings 38b of the same row.

Rows 42a and 42b are separated from one another and from the main openings 38a by portions 40. The portions 40, for example, all have the same widths, that is, the dimension in the X direction. As a variant, the width of the portions 40 decreases with the distance to the main opening 38a. In other words, the width of a given portion 40 is smaller than the widths of the portions 40 located between said given portion 40 and the main opening 38a. In the case of FIG. 4, the portion 40 separating the main opening 38a and the openings of row 42a, for example, has a width greater than that of the portion 40 separating the openings of row 42a from the openings of row 42b.

The dimensions of portions 44a and 44b are sufficient to maintain portions 40 outside of the etching of the cavity, that is, to avoid for the insulating and mask layers 34, 36 to come closer to the bottom of the cavity during the etching.

Preferably, the arrangement of rows 42 is symmetrical with respect to the main opening 38a, which enables to obtain at the end of the process a symmetrical cavity.

Thus, the rows 42 on one side of the main opening 38a are identical to the rows 42 of the other side of the main opening 38a. The row 42a, that is, the opening closest to the main opening 38a, located on the right-hand side of FIG. 4, is preferably identical to the row 42a on the other side of the main opening 38a. Similarly, the second row closest to one side of the opening, that is, one of rows 42b, is preferably identical to the second row closest to the other side of the opening. Further, portions 40 are symmetrical. Thus, each portion 40 is identical to the corresponding portion 40 on the other side of the main opening 38a. In the case of FIG. 4, the portion 40 located on one side of the main opening 38a between the main opening 38a and the closest row 42, that is, row 42a, is identical to the portion 40 located on the other side of the main opening 38a between the main opening 38a and the closest row 42. Similarly, the portion 40 located on a side of the main opening 38a between rows 42a and 42b is identical to the portion 40 located on the other side of the main opening 38a between rows 42a and 42b.

On a same side of the main opening 38a, the dimensions of the openings of rows 42 may be different. Similarly, the dimensions of the portions 44 of a row may be different from one row to another. Similarly, the dimensions of the portions 40 on a same side of the main openings 38a may be different.

Preferably, the secondary openings 38b of a same row 42 are all substantially at the same distance from the main opening 38a. By distance between the secondary opening 38b and the main opening 38a, there is meant the distance between the point of the secondary opening 38b closest to the main opening 38a and the point of the main opening 38a closest to the secondary opening 38b. Similarly, rows 42 are separated by a substantially constant distance. In other words, two openings of a same row 42 are separated from another row by substantially the same distance. By distance between a secondary opening 38b and a row 42, there is meant the distance between the point of said secondary opening 38b closest to row 42 and the point of an opening of row 42 closest to said secondary opening 38b.

FIG. 5 shows an alternative embodiment of FIG. 4. FIG. 5 differs from FIG. 4 in that main the main opening 38a is replaced with a row 46 of main openings 38a. The set of main openings 38a thus comprises a single row 46 of main openings 38a.

Row 46 is located at the location of the main opening 38a of FIG. 4. In the example of FIG. 5, row 46 is a straight line. The main openings 38a are, for example, identical to one another. For example, the main openings 38a have dimensions in the X direction identical to one another. The dimension in the X direction of the main openings 38a is, for example, substantially equal to the dimension in the X direction of the main opening 38a of FIG. 4.

As an alternative, the dimension in the X direction of the main openings 38a is, for example, different from the dimension in the X direction of the main opening 38a of FIG. 4. The total surface area of the main openings 38a is for example equal to the surface area of the main opening 38a of FIG. 4.

The main openings 38a are separated from one another by portions 50 of the stack of insulating and mask layers 34, 36. Portions 50 are, for example, identical to one another. The dimension of portions 50 in the Y direction is, for example, smaller than the dimension in the Y direction of the portions separating the secondary openings 38b of a same row, that is, portions 44a and 44b.

This embodiment has the advantage of a better hold of the stack of insulating and mask layers 34, 36 during the etching of the cavity.

FIG. 6 partially shows an alternative embodiment of the present disclosure, as illustrated in FIG. 4.

FIG. 6 differs from FIG. 4 in that a main opening 38a is replaced with at least two rows 52 of the main openings 38a. The set of main openings 38a thus comprises two rows 46 of openings 38a. In the example of FIG. 6, rows 52 are straight lines. Rows 52 are located at the location of the opening of FIG. 4.

Preferably, the main openings 38a of a same row 52 are identical to one another. Preferably, rows 52 are identical to one another. Rows 52 are separated from one another by portions 56 of the stack of insulating and mask layers 34, 36. Preferably, portions 46 are identical to one another. The main openings 38a of a same row 52 are separated from one another by portions 58 of the stack of insulating and mask layers 34, 36. Preferably, the portions 58 of a same row 52 are identical to one another. Preferably, the portions 58 of the different rows 52 are identical to one another. The dimensions in the X direction of portions 56 are preferably smaller than the dimensions in the X direction of portions 40.

The dimension of each main opening 38a in the X direction is smaller than the main opening 38a of FIG. 4. The dimension of each main opening 38a in the X direction is, for example, smaller than the dimension in the X direction of secondary openings 38b. Preferably, the total surface area of the main openings 38a of rows 52 is greater than the total surface area of the openings of each row 42a or 42b.

Figure 7:
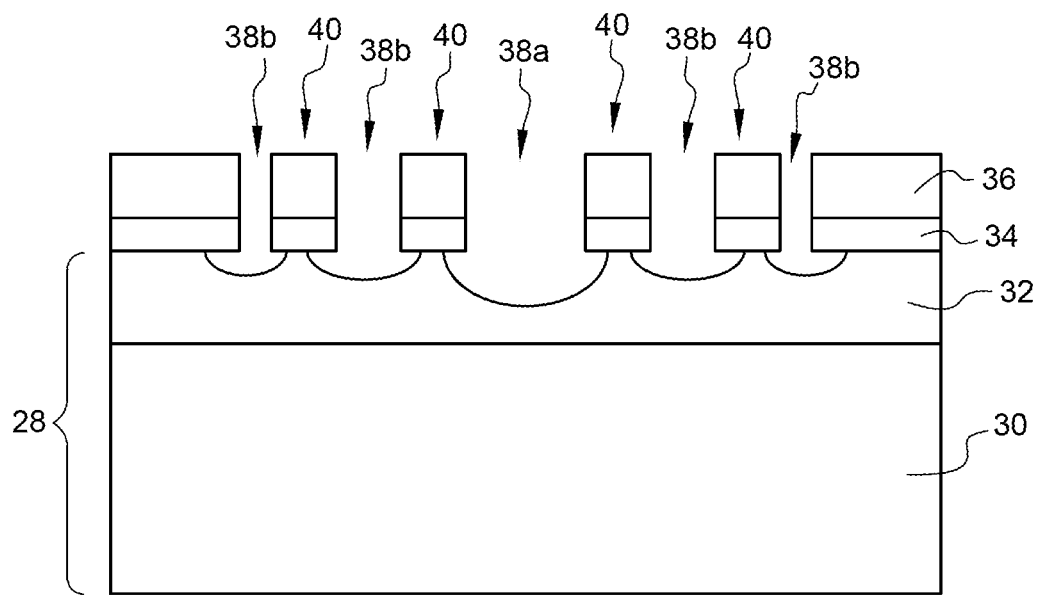
FIG. 7 shows another step of an embodiment of a cavity forming method.

FIG. 7 shows another step of an embodiment of a cavity forming method. Step 7 of FIG. 7 is carried out after the step of FIG. 3.

During this step, the etching of the substrate 28 has started. More precisely, the etching of the second doped semiconductor layer 32 has started. The etching is a wet etching. The etching is performed through all the openings 38 in the stack of the insulating and mask layers 34, 36.

Temporary cavities start forming in the substrate 28, and in particular in the second doped semiconductor layer 32. The temporary cavities develop during the etching from the portions exposed by openings 38. The temporary cavities develop in all directions in the substrate 28 and thus in depth and under the stack of the insulating and mask layers 34, 36, particularly under portions 40.

The speed of etching of the substrate 28, and thus the depth of the temporary cavities formed at this step, depend on the dimensions of the opening 38. Thus, the larger the opening, the faster and thus, for a given time, the deeper the etching.

As shown in FIG. 7, the temporary cavity formed under the main opening 38a is deeper and has a greater volume than the cavities formed under the secondary openings 38b. Similarly, the temporary cavity formed under a given secondary opening 38b has a depth greater than or equal to and has a volume greater than or equal to that of a temporary cavity formed under an opening more distant from the main opening 38a.

Figure 8:
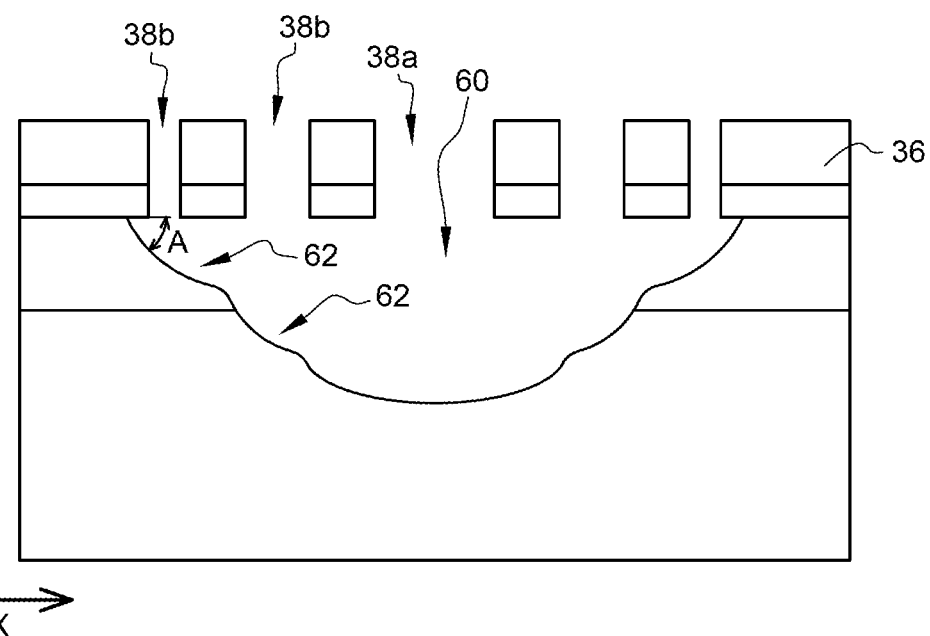
FIG. 8 shows another step of an embodiment of a cavity forming method.

FIG. 8 shows another step of an embodiment of a cavity forming method.

During this step, the wet etching of the cavity, started at the step of FIG. 7, is continued. The temporary cavities have continued to enlarge until they meet to form a single cavity 60.

The difference in etch speed at the level of the different openings causes a depth difference. Thus, the single cavity 60 is deeper opposite the main opening 38a and becomes increasingly shallow when the distance, in the X direction, to the main opening 38a increases.

Thus, the lateral walls of the single cavity 60 correspond to the walls of the different temporary cavities which have met and thus comprise different curved portions 62. The areas where the curved portions 62 meet are smoothed by the etching process.

The curvature of the lateral wall of the single cavity 60 at the level of the PN junction corresponds to the curvature of a temporary cavity having dimensions smaller than the dimensions of the cavity which would have been formed if the single cavity 60 was formed with a single opening in the mask 36. Said temporary cavity, for example, corresponds to a cavity such as that having a known forming mode and having walls having a curvature enabling to significantly decrease leakages at the level of the PN junction. Thus, the curvature at the level of the PN junction enables to significantly decrease leakages at the level of the PN junction and the total depth of the cavity is greater than the depth of the known cavities. For example, the maximum depth of the single cavity 60 is greater than 75 µm, for example, greater than 120 µm, for example, greater than 140 µm.

Further, the temporary cavities located opposite the secondary opening 38b most distant from the main opening 38a have the smallest dimensions. Thus, the curvature of said temporary cavities is such that the angle A between the lateral wall of the single cavity 60 and the plane of the upper surface of the substrate 28 is less abrupt than it could be in the case of the cavity which would have been formed if the single cavity 60 was formed with a single opening in the mask 36. Angle A is, for example, smaller than 90°, for example, smaller than 75°.

Portions 40 are held by the portions of the stack of the insulating and mask layers 34, 36 located between the secondary openings 38b of same rows. Thus, portions 40 do not collapse and do not separate from the substrate 28 during the etching process.

Figure 9:
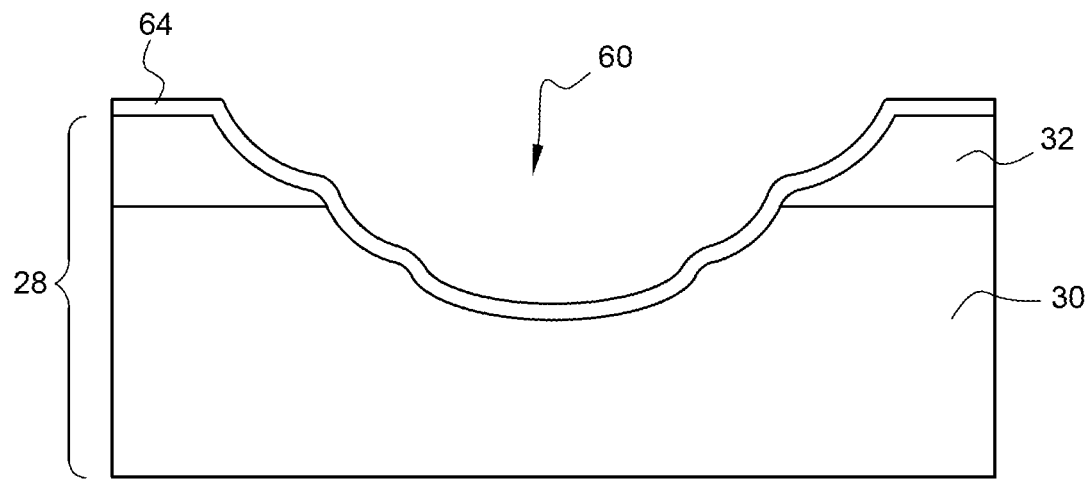
FIG. 9 shows another step of an embodiment of a cavity forming method.

FIG. 9 shows another step of an embodiment of a cavity forming method.

During this step, the insulating layer 34 and the mask layer 36 are removed. A fourth layer 64 is conformally formed on the structure resulting from the removal of the insulating and mask layers 34, 36. Thus, the fourth layer 64 covers the upper surface of the substrate 28, that is, the upper surface of second doped semiconductor layer 32, and the walls of the single cavity 60. All the walls of the single cavity 60, that is, the lateral walls and the bottom, are covered with the fourth layer 64.

The slope of the lateral walls of the single cavity 60 at the level of the angle of the opening of the cavity, that is, the angle between the lateral walls of the single cavity 60 and the upper surface of the second doped semiconductor layer 32, is sufficiently low for the fourth layer 64 to fully cover the angle. Thus, the thickness of the fourth layer 64 at the level of said angle is sufficient to hold the fourth layer 64 on the substrate 28 and to protect the substrate 28.

The fourth layer 64 may be comprised of an insulating material, such as oxide, polysilicon, or oxygen-doped silicon oxide. The fourth layer 64 enables the protection of the substrate 28 and decreases electrical leakages.

Figure 10:
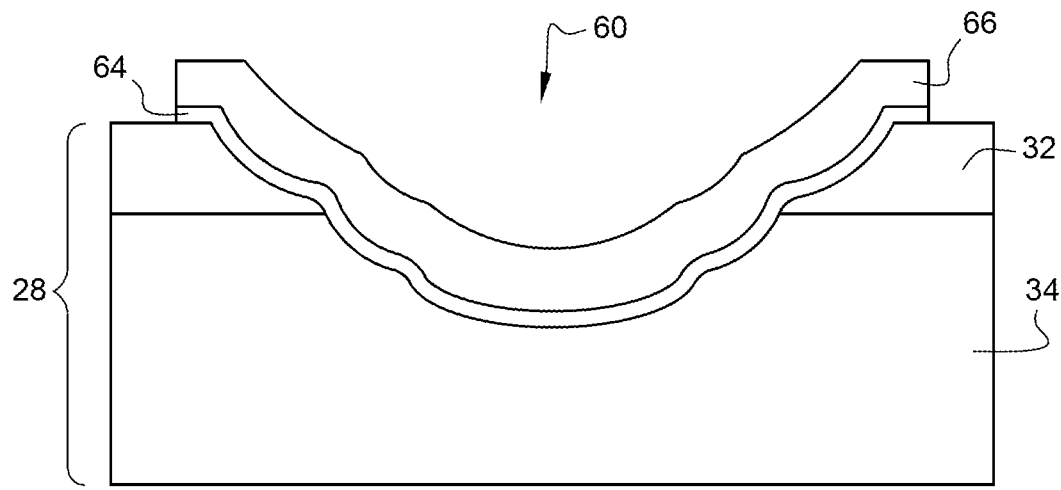
FIG. 10 shows another step of an embodiment of a cavity forming method.

FIG. 10 shows another step of an embodiment of a cavity forming method.

During this step, the fourth layer 64 is partially etched. More precisely, the fourth layer 64 is etched to leave a continuous portion of the fourth layer 64 comprising the portions of the fourth layer 64 located in the single cavity 60 and in the periphery of the single cavity 60.

The etching of the fourth layer 64 is, for example, performed by photolithography. The etching of the fourth layer 64, for example, comprises the forming of a resin mask 66 covering the portions of the fourth layer 64 located in the single cavity 60 and the portions directly surrounding the single cavity 60. The portions of the fourth layer 64 which are not covered with the resin mask 66 are then removed.

Figure 11:
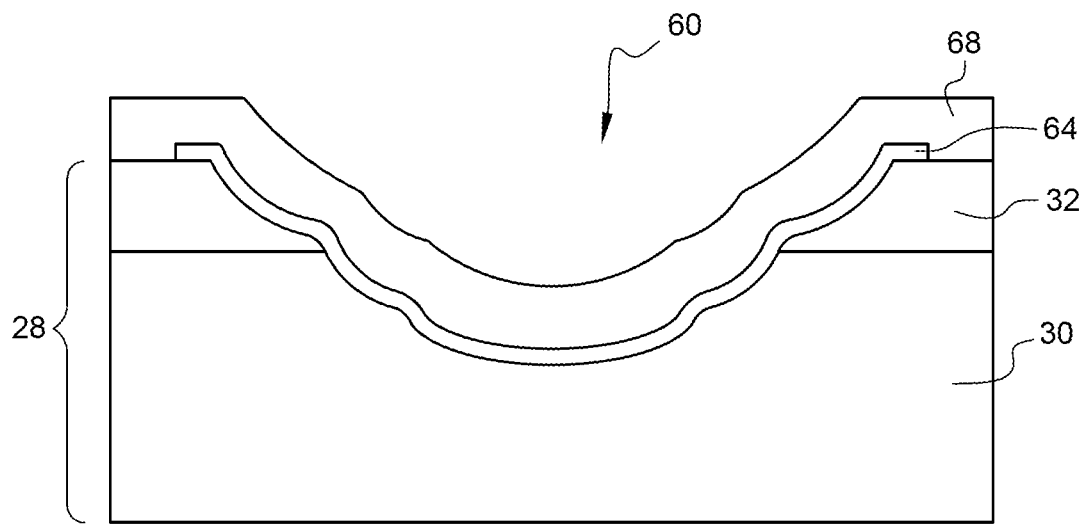
FIG. 11 shows another step of an embodiment of a cavity forming method.

FIG. 11 shows another step of an embodiment of a cavity forming method.

During this step, the resin mask 66 is removed. A protection layer 68 is formed on the structure resulting from the removal of the resin mask 66. The protection layer 68 is, for example, made of glass. The protection layer 68 particularly covers the upper surface of the substrate 28 and the fourth layer 64. In particular, the fourth layer 64 is fully covered with the protection layer 68. In the same way as for the fourth layer 64, the slope of the lateral walls of the single cavity 60 at the level of the angle of the opening of the cavity, that is, the angle between the lateral walls of the single cavity 60 and the upper surface of the second doped semiconductor layer 32, is sufficiently low for the protection layer 68 to fully cover the angle. Thus, the thickness of the protection layer 68 at the level of said angle is sufficient to hold the protection layer 68 on the fourth layer 64 and to protect the substrate 28.

Figure 12:
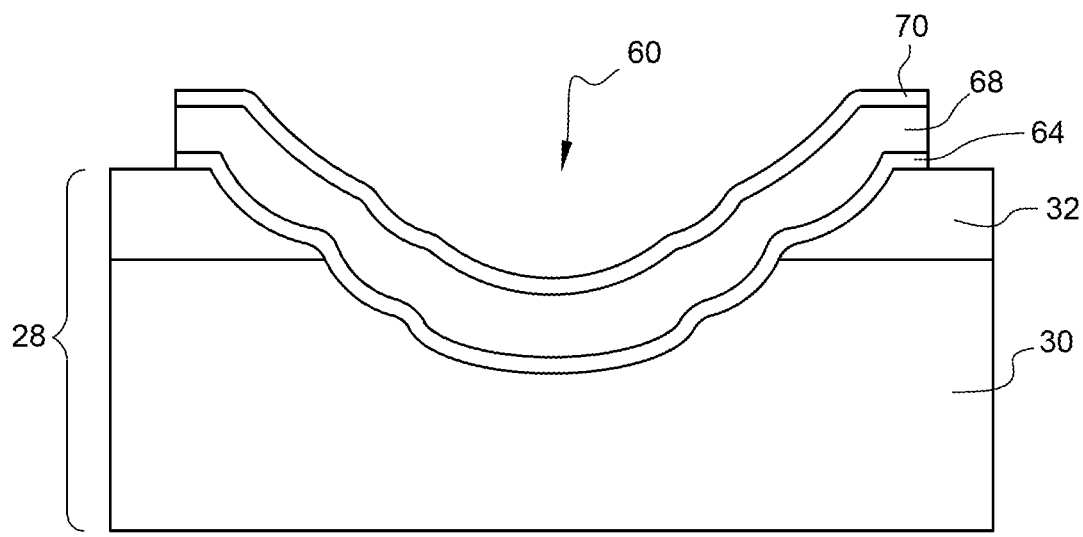
FIG. 12 shows another step of an embodiment of a cavity forming method.

FIG. 12 shows another step of an embodiment of a cavity forming method.

During this step, the protection layer 68 is partially etched, for example, by a photolithography method. The protection layer 68 is preferably etched to only keep the portion covering the fourth layer 64. Thus, the protection layer 68, after its etching, fully covers the fourth layer 64 and, preferably, is not in contact with the substrate 28.

The etching of the protection layer 68 comprises the forming of a mask 70 covering the portions of the protection layer 68 to be kept. Thus, the mask 70 is located opposite the fourth layer 64. The portions of the protection layer 68 which are not protected by the mask 70 are thus etched.

During a step subsequent to the step of FIG. 12, the mask 70 is removed.

To simplify the partial etching of the protection layer 68, the forming of the protection layer 68 may comprise the successive forming and etching of two, or more, protection layers 68 on each other, each having a smaller thickness than the final protection layer 68.

In the case where the single cavity 60 corresponds to a groove separating discrete devices or components during their manufacturing, the individualization of these devices or components may comprise the etching of the substrate 28 at the level of the cavities. The PN junctions are then protected by the protection layer 68.

Figure 13:
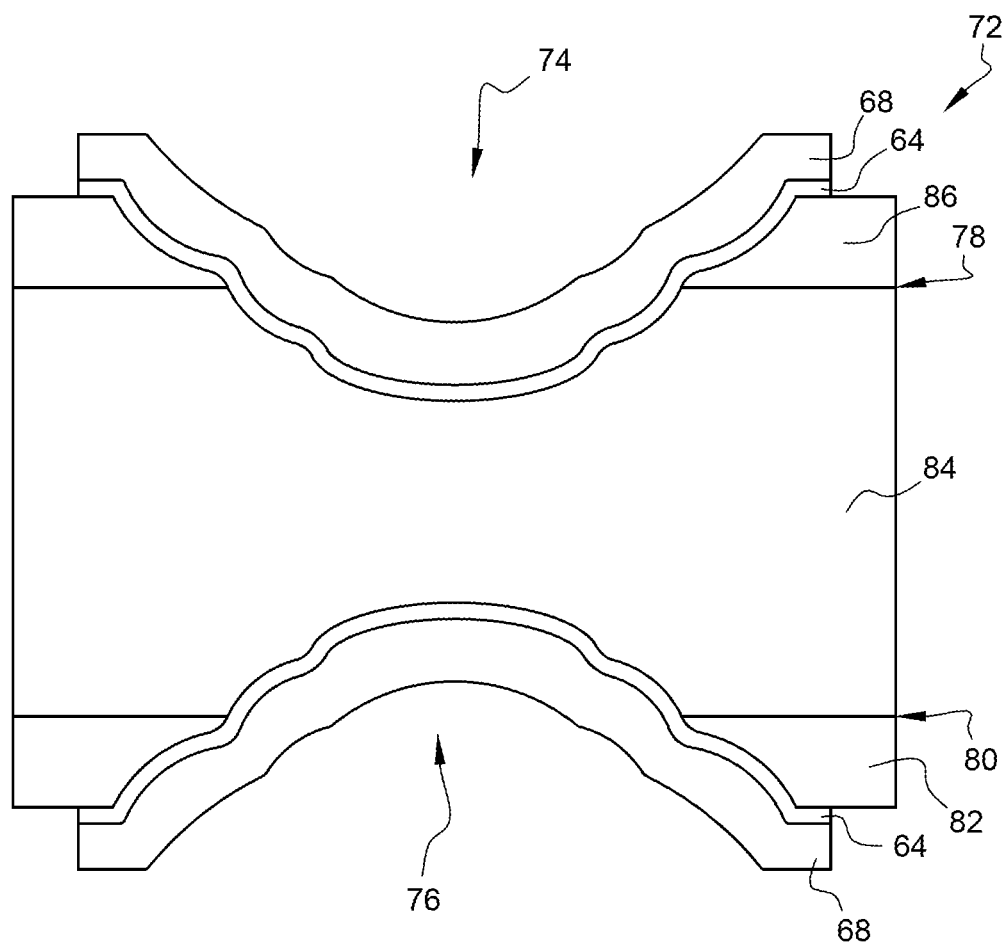
FIG. 13 shows a device comprising cavities.

FIG. 13 shows a device 72 comprising cavities 74 and 76, which may be referred to as a first cavity 74 and a second cavity 76.

The device 72 comprises at least two PN junctions 78 and 80, located on both sides of the semiconductor substrate 28 of the device 72. The substrate 28 then comprises at least a first doped semiconductor layer 82 of a first conductivity type, for example, of type N, a second doped semiconductor layer 84 of a second conductivity type, for example, of type P, and a third doped semiconductor layer 86 of the first conductivity type.

In the example of FIG. 13, the second semiconductor layer 84 is located between the first and third doped semiconductor layers 82, 86. The second semiconductor layer 84 is in contact with the third and first layers 86, 82 to form the two PN junctions 78, 80.

In an alternative embodiment, the device 72 may comprise another doped semiconductor layer, not shown, of the second conductivity type, the first and second layers 82, 84 being in contact to form the PN junction 80, and the layer which is not shown being in contact with the third doped semiconductor layer 86 to form the other PN junction 78. The second layer 84 and the layer which is not shown, may then be separated by other layers. The device 72 may, for example, comprise other PN junctions, which are not shown.

The cavities 76, 74 respectively cross the PN junctions 80, 78. The walls of the cavities 74, 76 have a curve such as previously described, that is, a curve designed to decrease leakages at the level of the PN junctions. Each cavity 74, 76 is covered with a stack of layers 64, 68, as previously described.

According to an embodiment, the method of manufacturing the device 72, for example, corresponds to the successive implementation of the previously-described method on one surface, and then on the second surface.

According to another embodiment, the previously-described manufacturing method is performed simultaneously on both sides of the device 72, except for the step of forming the photolithography masks 36, 66, 70, and of forming the protection layers 68, which are carried out successively, that is, on one side, and then on the other. In particular, the wet etch step is carried out simultaneously for both sides.

An advantage of the described embodiments is that it is possible to form cavities adapted to crossing deeper PN junctions.

Another advantage of the described embodiments is that it is possible to better control the curves of the cavity walls.

Another advantage of the described embodiments is that they enable to better protect the angle at the level of the opening of the cavity, by ascertaining that the angle is effectively covered with the stake of layers 64, 68.

Another advantage of the described embodiments is that the presence of the insulating layer 34 further enables the ability to thicken the thickness of layers the insulating layer 34 and the mask layer 36, to ascertain that the stack does not collapse and does not separate from the substrate 28 during the etch step, as could be the case in the absence of the insulating layer 34. Further, the presence of the insulating layer 34 provides a better control of the etching of the substrate 28. In particular, the presence of the insulating layer 34 decreases the risk of infiltration of the chemical components performing the etching between the substrate 28 and the stack of insulating and mask layers 34, 36 outside of the anticipated location of the cavity.

Various embodiments and variants have been described. Those skilled in the art will understand that certain features of these various embodiments and variants may be combined, and other variants will occur to those skilled in the art. In particular, although the shown openings 38 have, in top view, a rectangular shape, it should be understood that the openings 38 may have another shape, for example, a circular or oval shape.

Further, although the described embodiments show the cavity as being symmetrical, it is possible to form asymmetrical cavities, for example, between components for which walls having different curves are desired. The dimensions of the secondary openings 38b on one side may then be different from the dimensions of secondary openings 38b on the other side. The number of rows of secondary openings 38b may also be different on both sides of the cavity. For example, the mask layer 36 may comprise, on one side, at least one, preferably at least two, rows of parallel secondary openings 38b. On the other side of the main opening 38a, the mask layer 36 may comprise no secondary opening 38b or comprises at least one row of secondary openings 38b.

Although the embodiments describe the forming of a groove-shaped cavity, that is, a cavity having an opening of substantially rectangular shape, the method may be used to form cavities having other shapes. In particular, the embodiments may be used to form a cavity having an opening having a substantially circular or oval shape. Each row of secondary openings 38b thus surrounds main opening(s) 38a. For example, the main opening 38a may be a substantially circular opening, surrounded with rows of openings forming around the main opening 38a concentric circles.

Finally, the practical implementation of the described embodiments and variations is within the abilities of those skilled in the art based on the functional indications given hereabove.

A method of forming a cavity in a substrate may be summarized as including the forming of an etch mask including, opposite the location of the cavity, a plurality of sets of openings, the ratio between the openings and the mask of each set being selected according to the desired profile of the cavity opposite the surface of the mask having the set inscribed therein; and the wet etching of the substrate through the openings.

The ratio between the openings and the mask of each set may condition the depth of the cavity opposite the surface of the mask having the set inscribed therein.

The surface having a set of openings inscribed herein may be a continuous surface and may include no opening of another set.

The cavity may cross at least one PN junction.

The mask may include a first set of openings including at least one opening, and at least a second set, each second set including at least two openings, the ratio between the openings and the mask of the first set being greater than the ratio between the openings and the mask of each second set.

The ratio between the openings and the mask of the second sets may decrease with the increase of the distance between the second set and the first set.

The first set may include a single opening.

The first set may include a plurality of openings arranged in a row.

The first set may include a plurality of openings arranged in at least two parallel rows.

The openings of each second set may be arranged in a row parallel to the first set.

The arrangement of the second sets may be symmetrical with respect to the first set.

The mask may include a resin layer resting on an oxide layer.

The openings of a same set may be substantially identical to one another.

Method of manufacturing a device may be summarized as including a cavity obtained by a method, and including the forming of an electrically-insulating layer and of a protection layer on the cavity walls and on the substrate portion directly surrounding the cavity.

Method of manufacturing a device may be summarized as including two cavities located on opposite sides of the substrate, the two cavities being obtained by the method, wherein the wet etching step is carried out simultaneously for the two cavities.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a cavity in a substrate, the forming of the cavity including:
      forming a plurality of openings in an etch mask;
      forming the plurality of openings to have different spaces between adjacent ones of the plurality of openings, the forming of the plurality of openings including:
         forming a first opening aligned with a central region of the cavity;
         forming a plurality of second openings on a first side of the first opening and on a second side of the first opening, the first side spaced from the second side in a first lateral direction by the first opening; and
         forming a plurality of third openings on the first side of the first opening and on the second side of the first opening, the third openings being spaced farther from the first opening than are the second openings, the second openings having a greater width in the first direction than the third opening; and
   wet etching the substrate through the openings, the wet etching aligned with the first opening extending through a first doped layer and into a second doped layer in the substrate.

2. The method according to claim 1 a first group of the plurality of third openings being spaced from a second group of the plurality of third openings by the first opening and the plurality of second openings.

3. The method according to claim 2 wherein the first doped layer is a first conductivity type and the second doped layer is a second conductivity type that is different from the first conductivity type.

4. The method according to claim 3 wherein the first conductivity type is p type and the second conductivity type is n type, the cavity crossing at least one PN junction.

5. The method according to claim 2 wherein a first group of the plurality of second openings includes at least two openings, a ratio between the openings of the first group of the plurality of second openings and the mask being greater than a ratio between the first group of the plurality of third openings and the mask.

6. The method according to claim 5 wherein the first group of the plurality of second openings are arranged in a row along a first direction.

7. The method according to claim 6 wherein the first group of the plurality of third openings are arranged in a row along the first direction.

8. The method according to claim 7 wherein the first group of the plurality of third openings are not aligned with the first group of the plurality of second openings.

9. The method according to claim 7 wherein the first group of the plurality of third openings are aligned with the first group of the plurality of second openings.

10. The method according to claim 5 wherein first group of the plurality of second openings is symmetrical with respect a second group of the plurality of second openings.

11. A method, comprising:
    forming a device having a cavity in a substrate having a first doped layer on a second doped layer;
    forming the cavity through the first doped layer and into the second doped layer, the forming of the cavity including:
       forming a first plurality of openings in a mask in a central region of the cavity;
       forming a second plurality of openings in the mask on a first side and a second side of the central region of the cavity, a first number of the first plurality of openings being greater than a second number of the second plurality of openings;
       forming an electrically-insulating layer and a protection layer on walls of the cavity and on a surface of the substrate directly surrounding the cavity.

12. The method of claim 11 wherein forming the cavity includes forming third plurality of openings in the mask on the first side and the second side of the central region of the cavity.

13. The method of claim 12 wherein a third number of the third plurality of openings is less than the first number.

14. The method of claim 12 wherein the cavity has a largest dimension in a first direction aligned with the first plurality of openings and a smaller dimension in the first direction aligned with the third plurality of openings.

15. The method of claim 14 wherein the largest dimension extends through the first doped layer and into the second doped layer and the smallest dimension extends only into the first doped layer.

16. A method, comprising:
forming a first cavity on a first side of a substrate, including:
  forming a plurality of openings in a first etch mask;
  forming the plurality of openings to have different spaces between adjacent ones of the plurality of the openings, the forming of the plurality of openings including:
    forming a first opening aligned with a central region of the first cavity;
    forming a plurality of second openings on a first side of the first opening and on a second side of the first opening, the first side spaced from the second side in a first lateral direction by the first opening; and
    forming a plurality of third openings on the first side of the first opening and on the second side of the first opening, the third openings being spaced farther from the first opening than are the second openings, the second openings having a greater width in the first direction than the third opening;
forming a second cavity on a second side that is opposite to the first side of the substrate;
forming a second plurality of fourth openings in a second mask on the second side of the substrate;
wet etching the first side and the second side of the substrate through the first and second plurality of openings.

17. The method according to claim 16 wherein forming the cavity includes etching through a first doped layer and into a second doped layer in the substrate.

18. The method according to claim 17 wherein the wet etching includes simultaneously etching the first and second cavities.

\* \* \* \* \*